United States Patent [19]

Goodrich et al.

[11] Patent Number: 4,807,146
[45] Date of Patent: Feb. 21, 1989

[54] DIGITAL LOCK-IN AMPLIFIER

[75] Inventors: Roy G. Goodrich, Baton Rouge, La.; P. A. Probst, Grandvaux; B. Collet, Lausanne, both of Switzerland

[73] Assignee: Louisiana State University, Baton Rouge, La.

[21] Appl. No.: 831,719

[22] Filed: Feb. 19, 1986

[51] Int. Cl.[4] .............................................. G06F 15/20
[52] U.S. Cl. .................................... 364/481; 364/484; 324/78 D; 341/144
[58] Field of Search ............. 364/480, 481, 484, 486, 364/487, 570, 572, 178, 179, 724, 483, 580; 340/347 M, 347 AD, 347 NT; 330/75, 106, 147; 324/78 R, 78 D, 83 R, 83 D

[56] References Cited

U.S. PATENT DOCUMENTS

| | | | |
|---|---|---|---|
| 4,414,638 | 11/1983 | Talambiras | 364/481 |
| 4,506,332 | 3/1985 | Bloch et al. | 364/481 |
| 4,531,193 | 7/1985 | Yasuhara et al. | 364/484 |
| 4,534,004 | 8/1985 | Vollmayr | 364/481 |
| 4,628,461 | 12/1986 | Adams | 364/481 |
| 4,642,519 | 2/1987 | Nakatsugawa et al. | 364/487 |

OTHER PUBLICATIONS

Probst and Collet, "Low-Frequency Digital Lock-In Amplifier", Rev. Sci. Instrum 56(3), Mar. 1985, pp. 466-470.

Primary Examiner—Parshotam S. Lall
Assistant Examiner—Brian M. Mattson
Attorney, Agent, or Firm—James M. Pelton; E. E. Spielman

[57] ABSTRACT

A digital lock-in amplifier has a digital-to-analog converter connected between a central processing unit and a source of a signal to be detected or measured and which modulates the signal, an analog-to-digital converter connected between the source of the signal to be measured and the central processing unit, which includes a low pass filtered amplifier, a voltage controlled oscillator having a voltage offset reference supply and a counter, so that the modulated signal is converted to a series of electronic pulses counted over a set period, and a central processing unit which reads, resets and restarts the counter, analyzes the counts received, outputs digital information relating to the amplitude and phase of the signal to be measured or detected, reads a function table and outputs a signal to the digital-to-analog converter. A method detects and measure timed periodic signals using the above digital lock-in amplifier.

13 Claims, 5 Drawing Sheets

DIGITAL LOCK-IN AMPLIFIER

BACKGROUND OF THE INVENTION

This invention relates to a lock-in amplifier. More particularly, this invention relates to a novel form of lock-in amplifier which is a digital lock-in amplifier.

Lock-in amplifiers, also referred to as phase-sensitive detectors or synchronous amplifiers, are widely used in scientific laboratories to detect time periodic signals from a device or experiment that occurs with a definite phase relation to a reference signal. Previously, lock-in amplifiers were based on analog circuit techniques. However, the analog lock-in amplifiers inherently have a transient recovery time which is long compared to a period of the incoming signal. The long transient recovery times result from the use of exponential filters, such as cascaded and decoupled RC filters, which require about 10 periods to reach 99.9% of the final value. This can be quite long at low frequencies, indicating poor performance for analog lock-in amplifiers at frequencies of less than a few Hertz. Further, analog lock-in amplifiers provide no information regarding the harmonics of the time periodic signals and are sensitive to interfering frequencies at odd harmonics of the reference frequency employed. In addition, two complete analog lock-in amplifiers are required to simultaneously measure the time periodic signal response in phase and in quadrature with the reference frequency.

Digital lock-in amplifiers are viewed as a means to overcome some of the problems of analog lock-in amplifiers. The first digital lock-in amplifier was proposed by Cova et al, *Review of Scientific Instruments*, Vol. 50, page 296 (1979) in very simple form. It was not subject to some of the drawbacks of the analog lock-in amplifiers previously known and the output provided was in digital form for convenient numerical analysis or storage.

The skilled artisans would still prefer a digital lock-in amplifier which according to the present invention provides more information with the output of a digital lock-in amplifier and includes stabilizing and adjustment for the amplitude of the reference frequency used. Still further, the present invention contemplates a dual digital lock-in amplifier having one digital lock-in amplifier which measures two signals simultaneously and includes a feedback and control system for one of them. These and other advantages and objectives of the present invention are disclosed more fully hereinbelow.

THE INVENTION

The present invention provides a digital lock-in amplifier which comprises:
  (a) a digital-to-analog converter serially connected between a central processing unit and a source of a signal to be measured or detected whereby the signal to be measured is modulated by a reference signal output from the digital lock-in amplifier,
  (b) an integrating analog-to-digital converter serially connected between the source of a signal to be measured or detected and the central processing unit, the integrating analog-to-digital converter including an amplifier with a band pass filter, a voltage controlled oscillator and a counter, whereby the modulated signal is transformed into a series of electronic pulses the frequency of which is proportional to the voltage of the modulated signal and which are counted over a predetermined period, and
  (c) a central processing unit which reads, resets and restarts the counter, analyzes the counts according to a predetermined program and outputs digital information proportional to the amplitude and phase of the signal to be measured and its harmonics, reads a function table and outputs a digital signal to the digital-to-analog converter.

A further aspect of the present invention features a method of detecting and measuring timed periodic signals having phase relation to a reference signal generated by a digital lock-in amplifier, which method comprises the steps of
  (a) connecting the digital lock-in amplifier of claim 1 to a source of a signal to be detected and measured,
  (b) modulating the signal to be detected and measured with a reference signal converted to an analog signal from a digitized signal generated by the digital lock-in amplifier,
  (c) converting said modulated signal from an analog signal to a digital signal using an integrating analog-to-digital converter having an amplifier with a band pass filter, a voltage controlled oscillator having a direct current reference offset voltage supply and a counter to produce a digitized signal,
  (d) analyzing said digitized signal with a microprocessor according to a program derived from the logic flow scheme of FIG. 4, and
  (e) outputting digital information relative to the amplitude, phase and harmonic content of the timed periodic signal received, whereby the information desired by the detection and measurement is obtained.

DESCRIPTION OF THE DRAWINGS

The present invention is more readily disclosed by reference to the following Figures of the drawings, in which like numerals refer to like parts and in which.

DETAILED DESCRIPTION OF PREFERRED EMBODIMENTS

Figure 1:
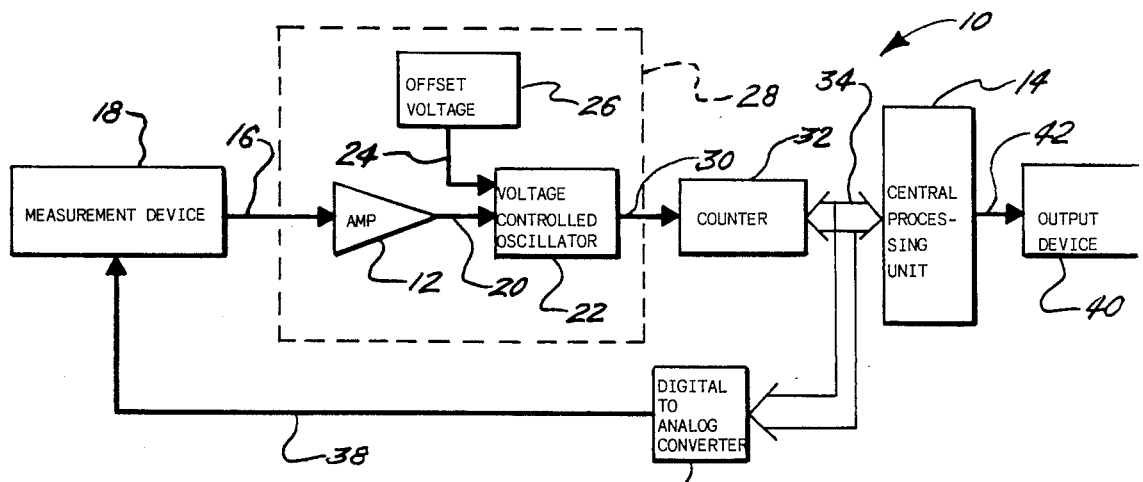
FIG. 1 represents a schematic block diagram of a simple digital lock-in amplifier of the present invention.

The present invention employs the principles of Cova et al in that it uses an integrating analog-to-digital converter for obtaining digitized information regarding the wave form to be studied. Referring to FIG. 1, there is shown a schematic block diagram representing a simplified digital lock-in amplifier, generally designated by the number 10, including an amplifier 12, which can have as a part thereof a low or band pas filter. Preferably the amplifier 12 is a programmable gain amplifier which can have the gain set by a central processing unit 14. The amplifier 12 is connected to receive a modulated analog signal, for example by means of line 16, from a device or experimental instrument 18 which is a source of the signal to be studied, detected or measured. The amplifier 12 output signal along line 20 is connected to any commercially available integrating analog-to-digital converter such as a voltage-to-frequency converter o voltage controlled oscillator 22 which also receives a high stability direct current reference offset voltage through line 24 from a supply source 26. These components are preferably isolated from the central processing unit 14 for low noise and stability. Increased stability of these components is achieved preferably by locating the amplifier 12, voltage controlled oscillator 22 and offset reference voltage supply source 26 in a temperature stabilized container, shown in phantom as 28, as is conventionally known in the art.

The voltage controlled oscillator 22 outputs a series of pulses via line 30, preferably a coaxial cable, to a counter 32 and double latch connected by data bus 34 to the central processing unit 14. The counter 32 is read, reset and restarted by central processing unit 14 in very short time compared to the counting time interval. The central processing unit 14 acting on instructions from a program, which is discussed hereinbelow, reads a function table generated by the central processing unit 14 and outputs a signal by means of a data bus 34 to a digital-to-analog converter 36 which provides a reference frequency via line 38 for modulating the signal carried by line 16 from device or experiment 18. Central processing unit 14 also provides digital information regarding the signal to be detected or measured including phase and harmonic information calculated by the programmed instructions to an output device 40 by means of line 42.

Figure 2:
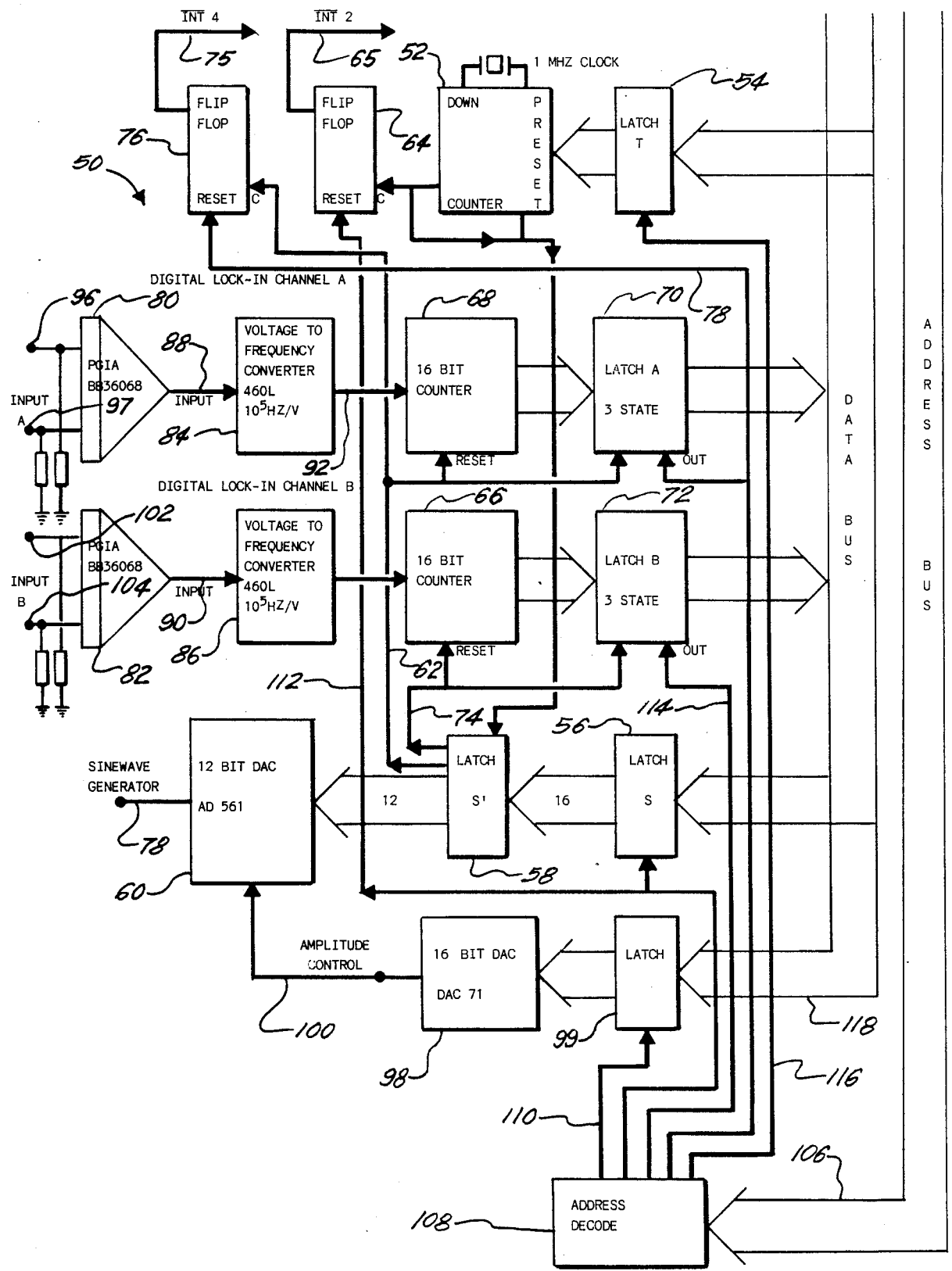
FIG. 2 represents a schematic block diagram of a dual digital lock-in amplifier having reference signal amplitude measuring, stabilizing and adjustment features.

Typically, the counter 32, central processing unit 14, output device 40 and digital-to-analog converter 36 are standard components available commercially and can be varied greatly in actual inplementation. In order to further decrease noise and ground loops the voltage controlled oscillator 32 can be electrically isolated from the counter and connected optically, using an opto-isolator, not shown, in line 30. Building on the principles of Cova et al a digital lock-in amplifier of the present invention was described by two of the present inventors, who have constructed a dual digital lock-in amplifier shown in FIG. 2. This embodiment of the present invention which is described in an article by Probst and Collet, entitled "Low-frequency digital lock-in amplifier", *Review of Scientific Instruments*, Vol. 56, No. 3, pages 466–470, March 1985, and which is incorporated herein by reference as is fully set forth, has the advantage of being able to measure the in phase and in quadrature components of the fundamental reference frequency and harmonics produced by the measurement device. In addition, a second channel can be used to measure and stabilize the amplitude of the reference signal used to modulate the time periodic signal to be detected or measured and to adjust the reference signal amplitude. As shown in FIG. 2, the dual digital lock-in amplifier, generally referred to as 50, is composed of standard low-power Schottky components wire wrapped on a prototype board, using 16-bit microcomputer modules, such as Texas Instruments 990/101 and the like; however, other similar components can be employed within the scope of the present invention. The component arrangement and method of use are generally as follows.

Figure 5:
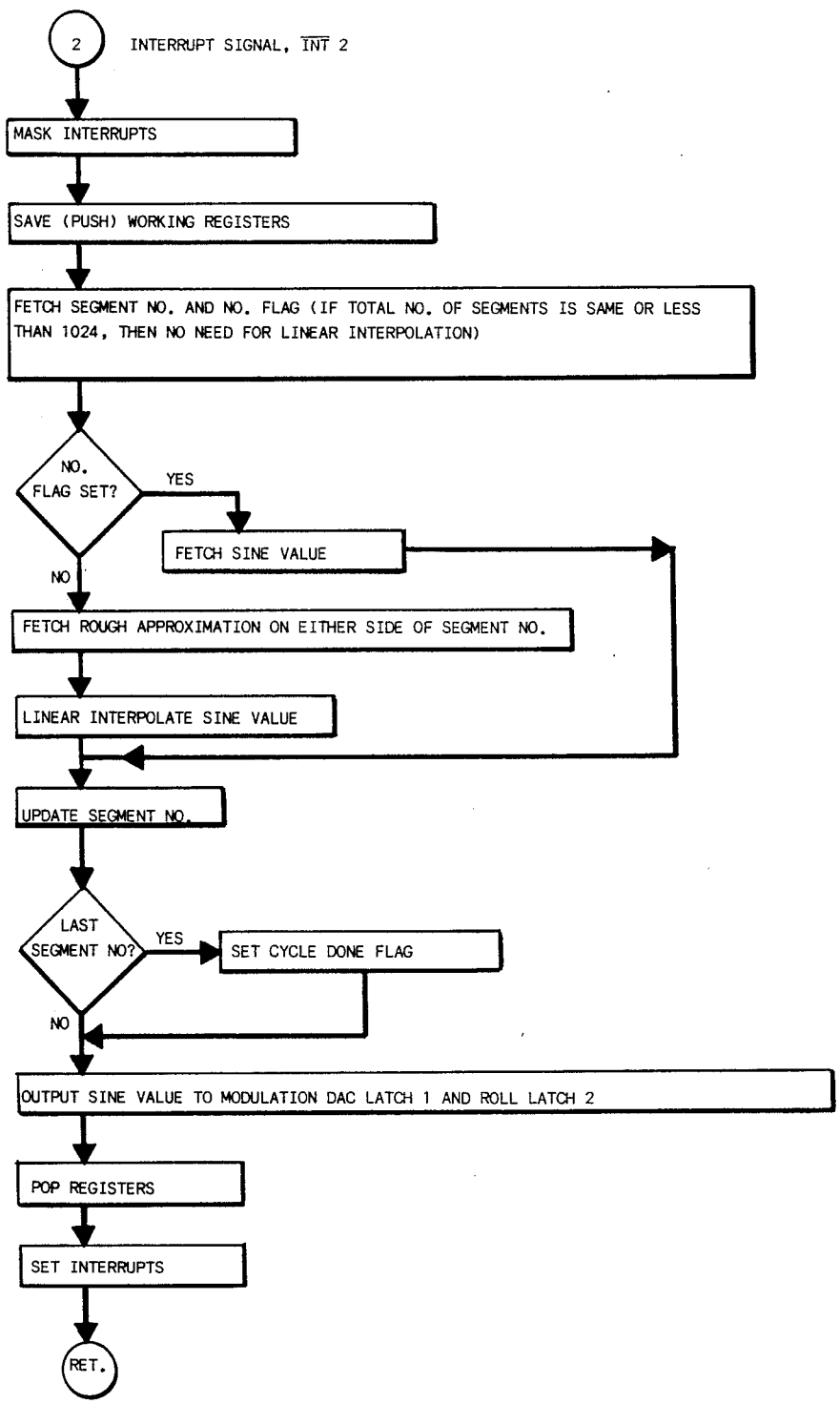
FIG. 5 represents a schematic logic flow diagram of that portion of the system software for calculating and outputting the modulation signal to the digital-to-analog converter of the digital lock-in amplifier.

An interval or period of time, $\Delta t$, is generated by a down counter 52 loaded with the number written in latch T, 54, each time its output reaches zero. At an interval $\Delta t$, the work in latch S 56 is shifted to latch S' 58 and the last 12 significant bits are converted to an analog value in multiplying digital-to-analog converter 60. Also, an interrupt of high priority, Interrupt 2, is generated through line 62 and flip flop 64 to the central processing unit (not shown). As indicated in FIG. 5 and described more fully below, Interrupt 2 shown at 65, causes the waveform synthesizing routine to output the next value of the waveform function and loads the next value or word in latch S 56 and resets flip flop 64 via line 112. The synthesizing program also generates the current segment number used in analyzing the waveform. This process assures synchronization between the reference signal produced by digital-to-analog converter 60 and the information from counters 66 and 68. The double latch system, i.e. latch S 56 and latch S' 58, assures phase stability even if the central processing unit takes longer to complete an instruction than the time between successive points on the waveform.

If the most significant bit of latch S'58 is set to one, the 16-bit counters 66 and 68 are latched and reset, along with latches A 70 and B 72 by means of a signal on lines 62 and 74. Further, an interrupt of lower priority, i.e., interrupt 4 (shown at 75), is generated, also through line 62 and flip flop 76, to signal the central processing unit to read latch A 70 and is reset through line 78 when latch A 70 is read. In another embodiment of the invention, the counter-latch arrangement is packaged into one chip and the number of external interrupts is reduced to one, namely Interrupt 2 described above and more fully referred to below.

When the analog signal is output from digital-to-analog converter 60, it is connected to the device or experiment (not shown) through line 78. This analog signal modulates a parameter affecting the signal generated by the device or experiment which is connected to the terminals of programmable gain amplifiers 80 and 82, such as a model BB3606B made by Burr Brown Company. The programmable gain amplifiers 80 and 82 input the modulated signal to voltage controlled oscillators 84 and 86 by mean of lines 88 and 90, respectively. The voltage controlled oscillators have a $\pm 5$ volt offset reference voltage applied and are 1 MHz full scale, less than $1.5 \times 10^{-4}$ of nonlinearity and 15 ppm/k gain stability. Typical of such voltage controlled oscillators is model 460L from Analog Devices.

In a dual channel version of the present invention, two voltage-to-frequency converters or voltage controlled oscillators 84 and 86 are connected, respectively, to 16-bit counters 68 and 66 by lines 92 and 94. One of the voltage-to-frequency conversion circuits, e.g. programmable gain amplifier 80, voltage controlled oscillator 84 and counter 68, is used to measure the incoming modulated signal through terminals 96 and 97. The other, e.g. programmable gain amplifier 82, voltage controlled oscillator 86 and counter 66, is used to measure and stabilize the amplitude of the modulation field by means of a 16-bit digital-to-analog converter 98 through latch 99 with the output going to the reference input of the multiplying digital-to-analog converter 60 via line 100. The incoming modulated signal from the device or experiment is received at terminals 102 and 104. These operations are set and ordered through the central processing unit on address bus 106 and address decoding unit 108 via lines 110, 112, 114, 78 and 116. Data from and to the different latches is carried on data bus 118. Further, a description of the operation of one channel of the above described dual digital lock-in amplifier unit 50 is given in connection with the software and its interaction with the central processing unit.

Figure 3:
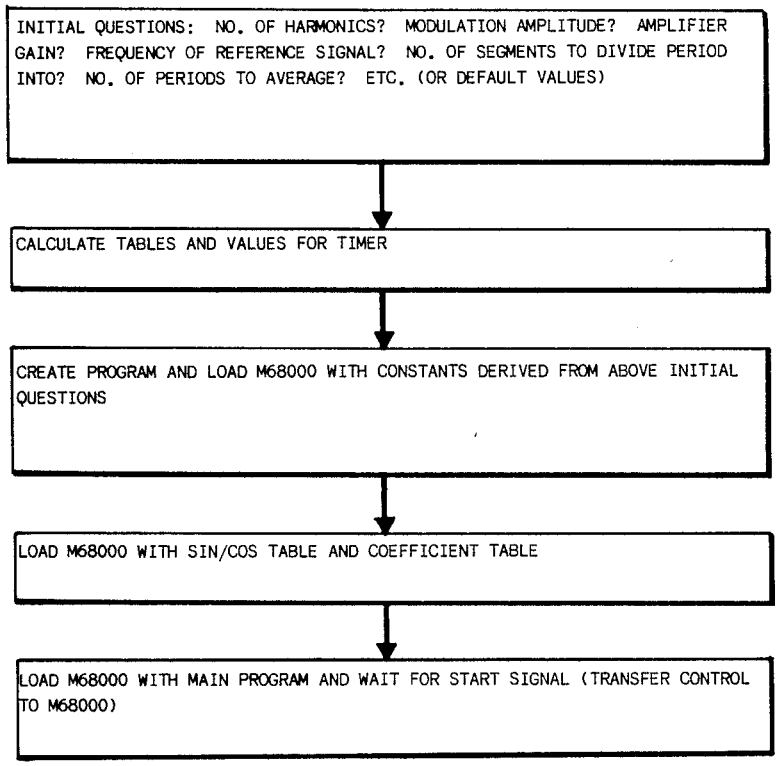
FIG. 3 represents a schematic block flow diagram of the system software logic for initialization of a digital lock-in amplifier.

Referring to FIG. 3, there is shown in schematic fashion the logic flow diagram for initiation of the program sequence for operation and data acquisition for one channel of the digital lock-in amplifier of the present invention. Although not limited to an particular central processing unit, the operation in FIG. 3 is initiated with a 640k RAM IBM-PC which is interfaced through a serial port to a single board computer containing a Motorola 68000 (10 mhz) central processing unit and 128k of RAM. After the program is booted into the main memory of the IBM-PC, the initial options are shown on the screen. As seen in FIG. 3, these take the form of several questions, including the number of harmonics, the modulation amplitude, the programmable amplifier gain, the frequency of the reference signal, the number of segments into which to divide the period, the number of periods to average, and the like. Alternatively, the initial options can be set with a series of default values which become operative if no value is selected by the operator. Upon completion of the initial options portion, the program creates the reference signal waveform function table and also loads the single board computer with constants derived from selection of the initial options. Then the waveform function table is loaded into the main memory of the single board computer. Then the main program is loaded into the single board computer and the program waits for a start signal which is given by the operator.

Figure 4:
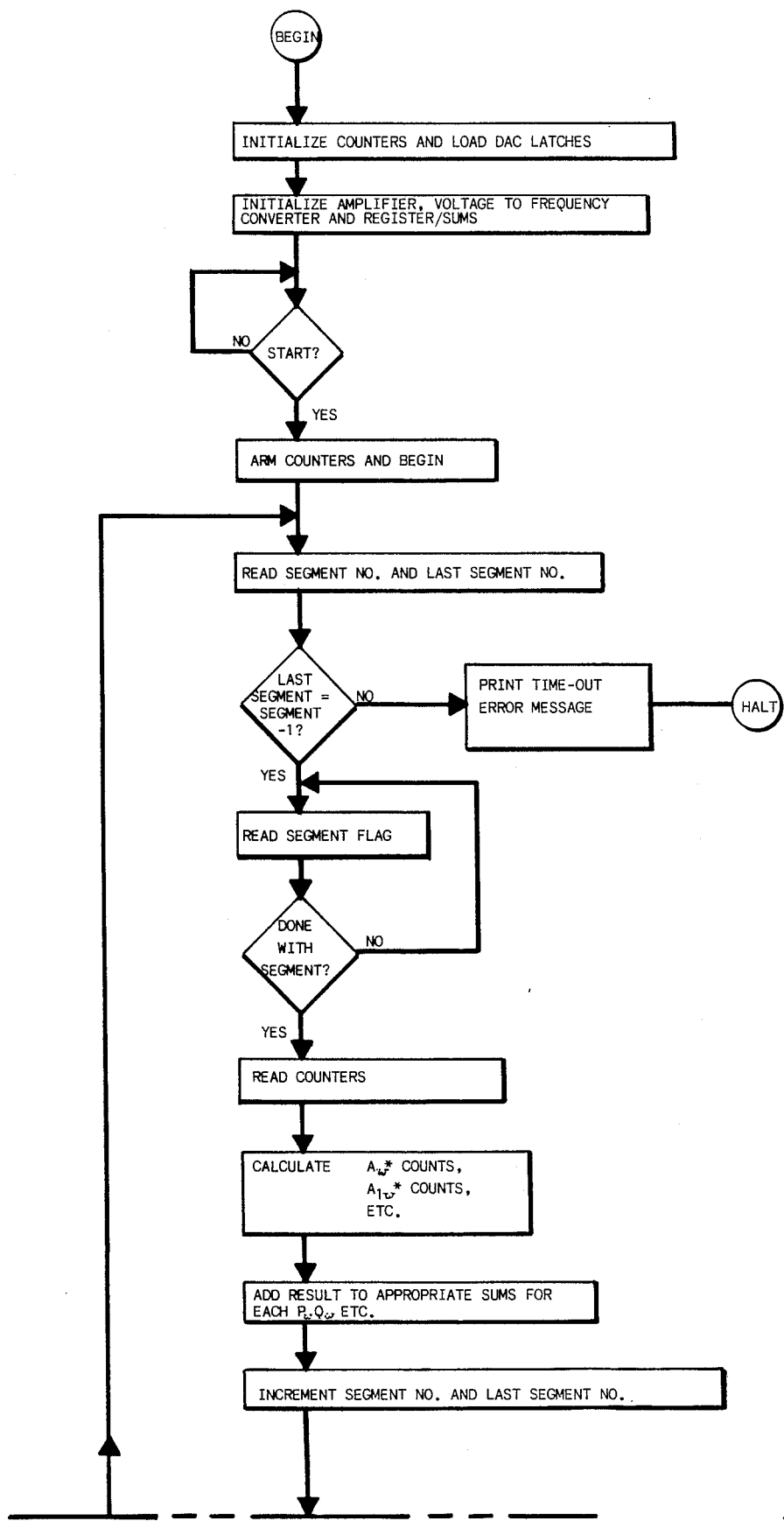
FIG. 4 represents a schematic logic flow diagram of the portion of the system software for reading the counters and performing the calculation to determine the signal parameters obtained by the digital lock-in amplifier.
Figure 4:
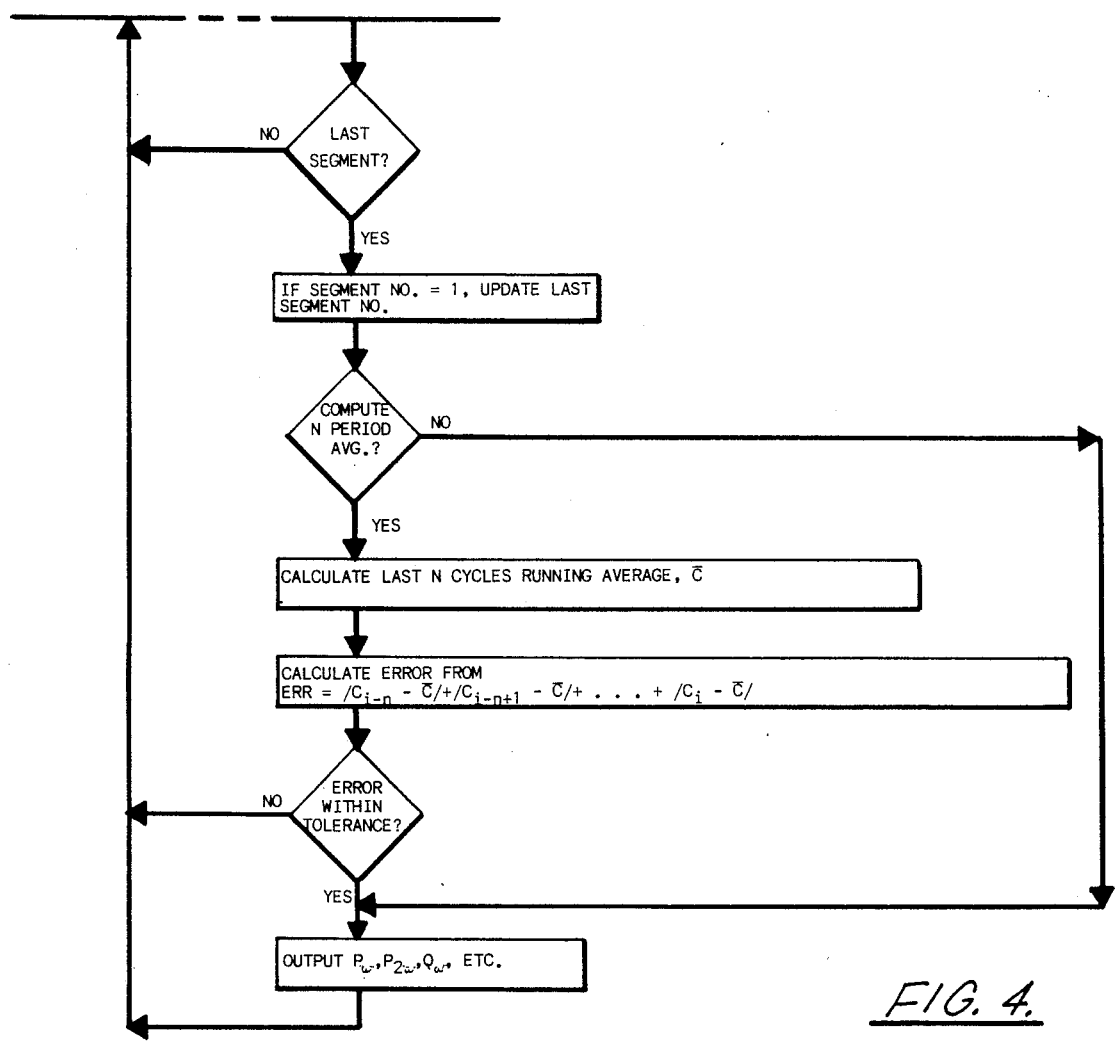

Once the program is loaded and the initial options are selected, the logic flow chart of FIG. 4 shows the method of proceeding. Using the mathematics underlying the present invention and hardware suggested in FIG. 2, the initial options selected cause the M68000 microprocessor to initialize the down counter and load the digital-to-analog converter latches. Next the initial values selected by the operator are set for the programmable gain amplifier. Also, pointers are set to the register in which calculated sums will be stored. Then the program goes into a holding loop awaiting the starting signal.

As explained by Probst and Collet, supra, each period of the reference waveform or frequency is divided into $2^k$ segments where k is selected by the operator during initialization.

When the start sequence is given, the counters are armed and started. The program reads the segment number to be processed of the selected reference waveform and the last processed segment number. If the current segment number minus one does not equal the last segment number, a time-out error message is printed and further progress is stopped until different information is input and the program reinitiated. This check assures that the loop is completed before the next segment is read. As usually will be the case, the current segment number will be one more than the previous segment number and the program proceeds to read the next segment flag. This flag indicates that the counters are ready to be read for the current segment. The program waits until the flag from the counters indicate a ready to be read state. Although this check may slow the operation, the hardware complexity is decreased by using software for such tasks and simplicity and flexibility are increased. If the current segment count is not completed, the program loops back to read the segment flag again. If the counting is complete the next step is to read the voltage controlled oscillator counters. When this is done, a calculation of the number of counts for this segment times each of the coefficients for this segment is done. These results are added to the appropriate sums and the last segment number is incremented. The program determines if the current segment is the last one for the period. If not, the program returns to the step of reading the next segment number, reading the counter, calculating counts times coefficient products and adding the results to the appropriate sums. If the segment was the last one, then the segment number is set to one and the last segment number is updated. If no average is to be taken (N=1), the information goes directly to output the in phase and quadrature components of the signal to be measured. If the results of N periods are to be averaged to eliminate the effects of transient noise during one period, then calculate the last number of cycles running average and using the formula developed for this determine the amount of error. The degree of error is determined to be or not to be within a specified tolerance. If the amount of error is within tolerance, an external parameter can be incremented for the next reading of the digital lock-in amplifier and the calculated in phase and quadrature components are output to a storage device. After output to the display or storage device the program returns for the next measurement of the signal.

A further position of the program software is the wave form modulation interrupt routine, referred to herein above as Interrupt 2. As specifically described herein, reference is made to a sine wave function as the modulating signal, although it should be recognized and understood that any desired waveform can be used as the modulating signal, so long as its characteristics are known and regular. The values of the coefficients $a_w$, $b_w$, etc., would have to be calculated and entered for the particular waveform being detected following the mathematics used in Probst and Collet, supra. Thus, the modulating signal can be a square wave, a rectangular wave, a saw tooth wave or the like without affecting the measurements or operation of the present invention as long as the coefficients for this waveform are calculated and stored in memory. As shown in FIG. 5, the interrupt signal, Interrupt 2 (see also FIG. 2 at 65) is generated by the start sequence of the program logic of FIG. 4. When the interrupt sequence starts, it first masks other interrupts. Then the program proceeds to save the working registers at which the program was operating when the interrupt occurred. The program fetches the interval number and number of intervals flag and then determines whether the number of intervals flag is set. If the number of intervals is less than or equal to the number of values in the function table, the flag is set. If it is set, the program fetches the corresponding sine value. If not, the program runs a linear interpolation on either side of the interval number. It should be pointed out again that the interval number is that portion of the wave function (e.g., the sine wave) under consideration, according to the number of different resolution elements employed. If the total number of resolution elements is less than or equal to 1024, then linear interpolation is not required. When the sine value is obtained, the interval number of the waveform is updated. The question of whether this is the last interval number is asked and if so, the cycle-done flag is set. If not, the program proceeds. The next step outputs the sine wave value to the modulation digital-to-analog converter latch, such as latch S 56 in FIG. 2, and shifts to latch S' 58. The registers are popped and the interrupt reset and the program returns to primary control at the position where it was stopped. This brief description of the software logic is sufficient to allow skilled programmers and those familiar with the art pertinent to the present invention to design and write specific program steps to accomplish the same tasks by different means. The presently used program is written in assembly language and not appropriate for reproduction herein.

The digital lock-in amplifier according to the present invention is useful in applications such as small signal processing, device control signal to noise improvement, seismograph, servo systems and research. It has the advantages of extended low frequency response, phase stability at low frequencies, harmonic rejection to high order, precise control, compatibility with micro-computers and very short transient recovery times.

The use of such digital lock-in amplifiers can be seen in the reference to Probst and Collet, incorporated herein by reference. As stated therein, radio frequency size effect experiments, which were reviewed by D. K. Wagner and R. Bowers, *Advances in Physics*, Vol. 27, page 651 (1978), were run using the digital lock-in amplifier of FIG. 2. The derivative of the surface impedance with respect to the magnetic field B was measured, using a small ac modulation field $B_m$ and a lock-in amplifier, a classical technique in solid-state physics experiments. As B is swept, sudden changes in the surface impedance (see FIG. 6) occur when electrons have a trajectory that fits exactly between the surfaces of the monocrystalline sample. The temperature dependence of this signal is mainly due to the electron-phonon interaction with a small deviation due to the electron-electron interaction in the low-temperature range (0.5–4 K.). To measure this deviation a precision of about $10^{-4}$ is needed. This is achieved using the dual digital lock-in amplifiers described in FIG. 2. No commercial lock-in amplifiers are capable of $10^{-4}$ stability for a few degrees of room-temperature fluctuation particularly at the low frequencies that have to be used (0.1–100 Hz) to assure penetration of the modulation magnetic field into high purity thick metallic samples.

Figure 6:
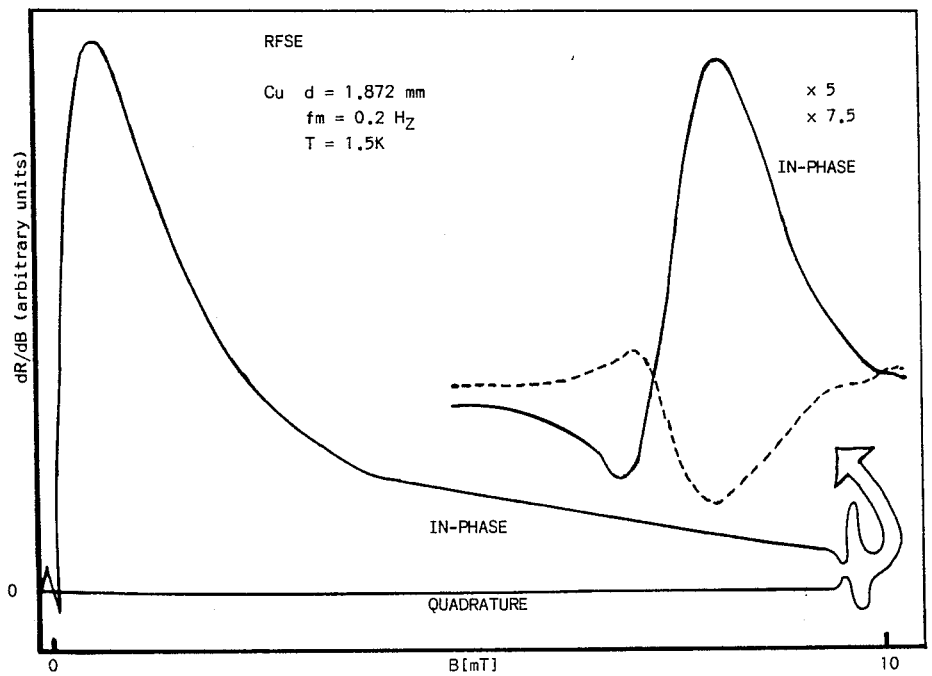
FIG. 6 shows an example of graphic presentation of data obtained using a digital lock-in amplifier of the present invention.

FIG. 6 shows a typical signal obtained from a copper sample 1.8-mm thick with a modulation frequency of 0.2 Hz. The signal strength at the discrete magnetic field value is an average over N periods taken in blocks of $N_g$ periods. The standard deviation $\sigma_g$ is calculated for $N_g$ periods. Typically $N_g=8$ but at very low frequencies, $N_g=2$ is used to avoid a "memory effect" from transient noise. If $\sigma_g$ is less than a preset value, these $N_g$ points are accepted and accumulated, otherwise they are rejected. Measurements are repeated until the uncertainty ($\sigma/\sqrt{N}$) in the in-phase and in-quadrature signal components is less than a set value $\sigma_{max}$ or N is greater than $N_{max}$. This permits long time averaging without bias from transient noise. The final trace is stored in the memory, the microprocessor stabilizes the sample temperature at a new value, and the measurements are repeated. The data are stored on a floppy disk for further analysis.

Having described the present invention in the best mode known at the present time, one skilled in the art would be aware of changes and variations within the scope of the claims. Therefore, it is desired that the present invention be limited only by the lawful scope of the following claims.

What is claimed is:

1. A digital lock-in amplifier which comprises (a) a digital-to-analog converter serially connected between (b) a central processing unit and a source of a signal to be measured and detected whereby said signal is modulated by a reference signal output by said digital-to-analog converter, and (c) an integrating analog-to-digital converter serially connected between said source of a signal to be measured and detected and said central processing unit, whereby said modulated signal is transformed into a digital number proportional to said modulated signal over a set time period, and said central processing unit reads, resets and restarts said converter of (c), analyzes said digital number according to a predetermined program and outputs digital information proportional to said signal to be measured and detected, reads a function table calculated by said program and outputs said reference signal to said digital-to-analog converter.

2. The digital lock-in amplifier of claim 1 in which said integrating analog-to-digital converter of (c) includes a voltage controlled oscillator and a counter.

3. The digital lock-in amplifier of claim 2 in which said integrating analog-to-digital converter further includes an amplifier for said modulated signal containing a band pass filter prior to said voltage controlled oscillator and a direct current reference offset voltage supply for said voltage controlled oscillator.

4. The digital lock-in amplifier of claim 3 in which said amplifier for said modulated signal is a programmable gain amplifier.

5. The digital lock-in amplifier of claim 4 in which said programmable gain amplifier and said voltage controlled oscillator are contained in a temperature stabilized container.

6. The digital lock-in amplifier of claim 5 in which said direct current reference offset voltage supply is also contained in said temperature stabilized container.

7. The digital lock-in amplifier of claim 3 in which a second analog-to-digital converter including a voltage controlled oscillator and a counter are used to measure and stabilize said reference signal in a feedback mode.

8. The digital lock-in amplifier of claim 7 in which said amplifier is a programmable gain amplifier.

9. The digital lock-in amplifier of claim 1 in which the central processing unit is a 16-bit microprocessor.

10. The digital lock-in amplifier of claim 1 in which said digital-to-analog converter for adjusting said reference signal is determined by a reference voltage supplied by a second digital-to-analog converter.

11. A method of detecting and measuring timed periodic signals having phase relation to a reference signal generated by a digital lock-in amplifier, which method comprises the steps of
 (a) connecting the digital lock-in amplifier to a source of a signal to be detected and measured,
 (b) modulating the signal to be detected and measured with a reference signal converted to an analog signal from a digitized signal generated by the digital lock-in amplifier,
 (c) converting said modulated signal from an analog signal to a digital signal using an analog-to-digital converter having an amplifier with a band pass filter, a voltage controlled oscillator having a direct current reference offset voltage supply and a counter to produce a digitized signal, (d) analyzing said digitized signal with a microprocessor according to a program derived from a predetermined logic flow diagram, and (e) outputting digital information proportional to said timed periodic signal received, whereby detection and measurement is accomplished.

12. The method of claim 11 in which said amplifier of step (c) is a programmable gain amplifier.

13. The method of claim 12 in which said programmable gain amplifier, voltage controlled oscillator and direct current reference offset voltage supply are contained in a temperature stabilized container.

* * * * *